United States Patent
Hahn et al.

(10) Patent No.: US 12,414,242 B2
(45) Date of Patent: Sep. 9, 2025

(54) METHOD FOR INK JET PRINTING OF A SUBSTRATE

(71) Applicant: NOTION SYSTEMS GMBH, Schwetzingen (DE)

(72) Inventors: David Hahn, Heidelberg (DE); David Volk, Heidelberg (DE); Jan Schönefeld, Leimen (DE); Carsten Schimansky, Sinsheim (DE)

(73) Assignee: NOTION SYSTEMS GMBH, Schwetzingen (DE)

( * ) Notice: Subject to any disclaimer, the term of this patent is extended or adjusted under 35 U.S.C. 154(b) by 377 days.

(21) Appl. No.: 17/523,747

(22) Filed: Nov. 10, 2021

(65) Prior Publication Data
US 2022/0192035 A1 Jun. 16, 2022

Related U.S. Application Data

(63) Continuation of application No. 16/900,184, filed on Jun. 12, 2020, now Pat. No. 11,330,719.

(30) Foreign Application Priority Data

Jun. 13, 2019 (DE) .......................... 102019116103.7

(51) Int. Cl.
*H05K 1/02* (2006.01)
*B05D 7/26* (2006.01)
*H05K 1/09* (2006.01)
*H05K 3/00* (2006.01)
*H05K 3/22* (2006.01)
(Continued)

(52) U.S. Cl.
CPC ................. *H05K 3/22* (2013.01); *B05D 7/26* (2013.01); *H05K 1/0266* (2013.01); *H05K 3/4664* (2013.01); *H05K 2201/09936* (2013.01); *H05K 2203/013* (2013.01)

(58) Field of Classification Search
CPC .......... H05K 1/02; H05K 1/0266; H05K 1/09; H05K 1/11; H05K 1/18; H05K 3/00; H05K 3/22; H05K 3/34; H05K 3/40; H05K 3/4664; H05K 7/00; H05K 2201/09936; H05K 2203/013; B05D 7/26
USPC ...... 29/829; 427/96.1, 163.1, 256, 511, 553, 427/585; 174/250, 258, 260–264; 430/257–260, 262, 263, 291, 331, 461
See application file for complete search history.

(56) References Cited

U.S. PATENT DOCUMENTS 3,867,493 A * 2/1975 Seki .................. B29C 44/468
264/177.17
3,909,282 A 9/1975 Gray
(Continued)

FOREIGN PATENT DOCUMENTS

| JP | 2000-158787 A | 6/2000 |
| JP | 2004-063560 A | 2/2004 |
| JP | 2011-54678 A | 3/2011 |

*Primary Examiner* — Timothy J. Dole
(74) *Attorney, Agent, or Firm* — Caesar Rivise, PC

(57) ABSTRACT

A method for ink jet printing of a substrate, as well as an ink jet printed layer. To provide a method for ink jet printing of a substrate that is particularly fast and energy-conserving and does not require any systems with high procurement and operating costs, initially a substrate is supplied, which is then coated with a layer of a print medium on at least one surface. A labeling of the substrate is carried out by applying the same print medium to result in a different color shade of the printed layer.

9 Claims, 1 Drawing Sheet

(51) Int. Cl.
  *H05K 3/34* (2006.01)
  *H05K 3/40* (2006.01)
  *H05K 3/46* (2006.01)
  *H05K 7/00* (2006.01)

(56) References Cited

U.S. PATENT DOCUMENTS

| | | | |
|---|---|---|---|
| 4,088,828 A | 5/1978 | Yamamoto | |
| 4,210,346 A | 7/1980 | Mowry, Jr. | |
| 4,265,469 A | 5/1981 | Mowry, Jr. | |
| 4,301,232 A | 11/1981 | Kullen | |
| 4,474,725 A | 10/1984 | Sands | |
| 4,801,768 A | 1/1989 | Sugiyama | |
| 4,935,264 A | 6/1990 | Tsujino | |
| 5,119,115 A | 6/1992 | Buat | |
| 5,225,900 A * | 7/1993 | Wright | H04N 1/38 382/312 |
| 5,266,748 A | 11/1993 | Kawakami | |
| 5,292,613 A | 3/1994 | Sato | |
| 5,397,678 A | 3/1995 | Sato | |
| 5,562,975 A * | 10/1996 | Sugai | B41M 5/5218 428/32.5 |
| 5,867,826 A | 2/1999 | Wilkinson | |
| 5,877,895 A * | 3/1999 | Shaw | G02B 5/286 359/589 |
| 6,092,947 A * | 7/2000 | Nunokawa | B41J 11/26 400/615.2 |
| 6,109,798 A * | 8/2000 | Nunokawa | F16G 11/10 400/615.2 |
| 6,172,688 B1 | 1/2001 | Iwasaki | |
| 6,180,018 B1 | 1/2001 | Miyagawa | |
| 6,219,912 B1 | 4/2001 | Shimizu | |
| 6,264,747 B1 | 7/2001 | Shaw | |
| 6,386,674 B1 | 5/2002 | Corrigan, III | |
| 6,503,307 B1 | 1/2003 | Noguchi | |
| 6,514,621 B1 | 2/2003 | Marietti | |
| 6,666,983 B2 | 12/2003 | Marietti | |
| 6,670,091 B1 | 12/2003 | Hatakeyama | |
| 7,200,259 B1 | 4/2007 | Gold | |
| 8,362,363 B2 | 1/2013 | Okada | |
| 9,259,762 B2 | 2/2016 | Mizuno | |
| 2001/0040598 A1 | 11/2001 | Dunand | |
| 2002/0061723 A1 | 5/2002 | Duescher | |
| 2002/0102289 A1 | 8/2002 | Drucks | |
| 2002/0138920 A1 | 10/2002 | Pepitone | |
| 2002/0150737 A1 | 10/2002 | Nakashima | |
| 2003/0157305 A1 | 8/2003 | Abraham | |
| 2003/0170558 A1 | 9/2003 | Hatakeyama | |
| 2004/0106061 A1 | 6/2004 | Gotoh | |
| 2004/0194653 A1 | 10/2004 | Taffinder | |
| 2005/0057599 A1 | 3/2005 | Takenaka | |
| 2005/0206866 A1 * | 9/2005 | Ozaki | G03F 7/70283 355/53 |
| 2006/0159635 A1 | 7/2006 | Meyer | |
| 2006/0159637 A1 | 7/2006 | Meyer | |
| 2006/0246149 A1 | 11/2006 | Buchholz | |
| 2007/0159581 A1 | 7/2007 | Moriya | |
| 2008/0002079 A1 * | 1/2008 | Kimura | G02F 1/134363 349/141 |
| 2008/0038213 A1 | 2/2008 | Carola | |
| 2008/0049277 A1 | 2/2008 | Usui | |
| 2008/0055355 A1 | 3/2008 | Hersch | |
| 2008/0080165 A1 | 4/2008 | Kim | |
| 2008/0110858 A1 * | 5/2008 | Itoh | H01L 27/1214 216/41 |
| 2008/0121413 A1 | 5/2008 | Cardona | |
| 2008/0259120 A1 | 10/2008 | Misumi | |
| 2008/0265254 A1 * | 10/2008 | Nishiura | H01L 27/1255 257/E27.113 |
| 2009/0008645 A1 * | 1/2009 | Yamazaki | H01L 29/78678 257/59 |
| 2009/0009677 A1 * | 1/2009 | Yamazaki | H01L 29/78696 349/43 |
| 2009/0110843 A1 | 4/2009 | Halahmi | |
| 2009/0194154 A1 | 8/2009 | Takahashi | |
| 2009/0267173 A1 | 10/2009 | Takahashi | |
| 2009/0268566 A1 | 10/2009 | Hiroe | |
| 2010/0028067 A1 | 2/2010 | Wanibuchi | |
| 2010/0051988 A1 | 3/2010 | Mitsuishi | |
| 2010/0065317 A1 | 3/2010 | Okada | |
| 2010/0067163 A1 | 3/2010 | Nozoe | |
| 2010/0231646 A1 | 9/2010 | Misumi | |
| 2010/0238219 A1 | 9/2010 | Rueby | |
| 2010/0238511 A1 | 9/2010 | Neese | |
| 2010/0271411 A1 | 10/2010 | Iritani | |
| 2010/0296127 A1 | 11/2010 | Barndt | |
| 2010/0315458 A1 | 12/2010 | Kato | |
| 2011/0003418 A1 * | 1/2011 | Sakata | H01L 29/66969 438/34 |
| 2011/0018088 A1 | 1/2011 | Seike | |
| 2011/0186982 A1 | 8/2011 | Kitani | |
| 2011/0206916 A1 | 8/2011 | Siebert | |
| 2011/0222278 A1 | 9/2011 | Lee | |
| 2012/0050407 A1 | 3/2012 | Sekino | |
| 2012/0050537 A1 | 3/2012 | Ringermacher | |
| 2012/0152400 A1 | 6/2012 | Michishita | |
| 2012/0268658 A1 | 10/2012 | Hasegawa | |
| 2013/0209818 A1 | 8/2013 | Fairclough | |
| 2014/0098152 A1 * | 4/2014 | Mishima | B41J 2/2054 347/15 |
| 2014/0166354 A1 | 6/2014 | Fan | |
| 2014/0168673 A1 | 6/2014 | Barndt | |
| 2014/0202749 A1 | 7/2014 | Saitou | |
| 2014/0225362 A1 * | 8/2014 | Quinn | B42D 25/435 101/483 |
| 2014/0318846 A1 | 10/2014 | Hayashi | |
| 2015/0015650 A1 | 1/2015 | Landa | |
| 2015/0042736 A1 | 2/2015 | Landa | |
| 2015/0044431 A1 | 2/2015 | Landa | |
| 2015/0165759 A1 | 6/2015 | Landa | |
| 2015/0262048 A1 | 9/2015 | Barndt | |
| 2015/0262962 A1 | 9/2015 | Matsumoto | |
| 2015/0296627 A1 * | 10/2015 | Ben-Abu | H05K 1/0254 174/250 |
| 2015/0339824 A1 * | 11/2015 | Uliyar | G06T 7/557 348/46 |
| 2016/0075130 A1 | 3/2016 | Landa | |
| 2016/0143150 A1 | 5/2016 | Happoya | |
| 2016/0205771 A1 | 7/2016 | Hashimoto | |
| 2016/0207306 A1 | 7/2016 | Landa | |
| 2017/0008272 A1 | 1/2017 | Landa | |
| 2017/0021638 A1 | 1/2017 | Barndt | |
| 2017/0080706 A1 | 3/2017 | Landa | |
| 2017/0113455 A1 | 4/2017 | Landa | |
| 2017/0145606 A1 * | 5/2017 | Toye | D04B 21/10 |
| 2017/0208689 A1 | 7/2017 | Fukuzumi | |
| 2017/0361602 A1 | 12/2017 | Landa | |
| 2018/0065358 A1 | 3/2018 | Landa | |
| 2018/0079201 A1 | 3/2018 | Landa | |
| 2018/0117906 A1 | 5/2018 | Landa | |
| 2018/0154628 A1 | 6/2018 | Landa | |
| 2019/0023000 A1 | 1/2019 | Landa | |
| 2019/0059855 A1 | 2/2019 | Jin | |
| 2019/0118530 A1 | 4/2019 | Landa | |
| 2019/0157503 A1 | 5/2019 | Hung | |
| 2019/0189001 A1 | 6/2019 | Smothers | |
| 2019/0193391 A1 | 6/2019 | Landa | |
| 2019/0202198 A1 | 7/2019 | Shmaiser | |
| 2019/0301891 A1 * | 10/2019 | Rowitch | G01C 21/3694 |
| 2019/0329568 A1 | 10/2019 | Barndt | |
| 2019/0366705 A1 | 12/2019 | Landa | |
| 2020/0194518 A1 * | 6/2020 | Myung | H10K 59/10 |

* cited by examiner

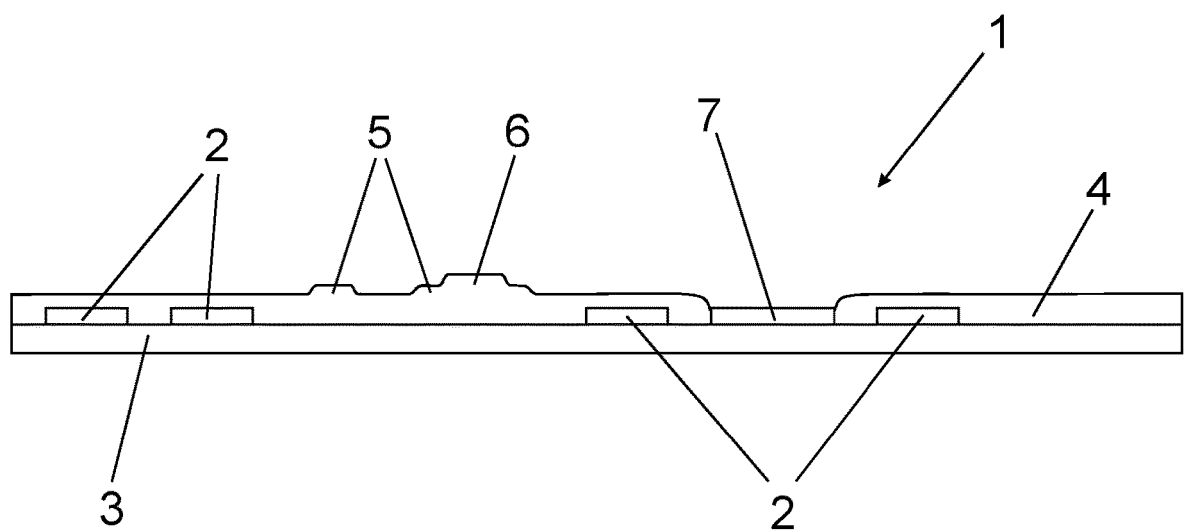

METHOD FOR INK JET PRINTING OF A SUBSTRATE

The invention relates to a method for ink jet printing of a substrate.

Various methods are known from the prior art for producing and labeling electric printed circuit boards, as well as corresponding printed circuit boards. In so doing, typically holes as well as vias, if applicable, are initially created in a substrate consisting of fiber-reinforced plastic, and then the conductive tracks are produced on the substrate by illumination and by etching.

Subsequently, a coating with a solder resist is then typically created in order to help with subsequently populating the printed circuit board with electronic components, and with soldering these components. The solder resist coating is applied for example by a screen-printing method, or in a photographic manner in the form of a surface coating. Afterwards, this solder resist layer must be left to dry, or actively dried by means of an oven.

After this coating with a solder resist, the printed circuit board is labeled by printing on the surface of the solder resist which in particular is also done in a screen-printing method or photographically. The labeling must also be left to dry before further use or before packing the coated and labeled printed circuit boards.

Said drying typically lasts at least 30 minutes, which leads to a disadvantageous delay in production. Alternatively, the drying can be accelerated by means of a drying oven whose performance however lies within a range of a multiple of 10 kW and therefore has high operating costs. In general, a corresponding system which is expensive to procure and operate and requires a corresponding setup site due to its size must be used for such labeling and subsequent drying of the printed circuit boards.

The object of the invention is therefore to provide a method for producing a labeled printed circuit board that is particularly fast and energy-saving and does not require any systems with high procurement and operating costs.

The object is achieved by a method as well as an electrical printed circuit board of the invention.

In the method for producing a labeled printed circuit board according to the invention, first a substrate provided with conductive tracks is supplied and is subsequently coated on at least one surface with a functional lacquer coating, wherein moreover a labeling of the substrate is created in different color shades of the functional lacquer layer.

The electric printed circuit board according to the invention has conductive tracks arranged at least on the surface of a substrate, and an at least partial surface coating with a functional lacquer layer as well as a labeling of the printed circuit board created by different color shades of the functional lacquer layer.

The inventors have found that the separate method step of labeling by means of a labeling lacquer can also be omitted if the functional lacquer layer is previously applied on the substrate in particular by means of a solder resist in different layer thicknesses, whereby thicker regions of the functional lacquer layer are more strongly visible and therefore can be used for a labeling, in particular when a colored or partially transparent lacquer is used. Advantageously, the expensive and large systems for labeling after coating with the functional lacquer layer are no longer needed, and moreover the method for producing a printed circuit board is significantly shortened since not just the separate method step of coating, but also the prolonged drying of the labeling can be omitted. Moreover, significant energy conservation can be achieved since drying the labeling, which generally occurs in an oven, is no longer necessary.

The printed circuit board is in principle a part or an assembly for mechanically affixing and/or at least partially, preferably completely, electrically connecting electronic parts and components. The printed circuit board can have any size, be produced in one or several parts, and be made of any desired material. The printed circuit board is preferably a board, a printed circuit, or a part thereof. Preferably, the printed circuit board is formed flat, and/or at least one surface is provided flat for receiving electrical parts.

The base of the printed circuit board is thereby formed by the substrate that forms at least the mechanical basic structure of the printed circuit board, and/or is provided to receive all of the further components of the printed circuit board. The substrate preferably extends over the entire surface of the printed circuit board. In principle, the substrate can be formed from any desired material, wherein a substrate consisting of a fiber-reinforced plastic or hard paper is preferred. Moreover, the substrate can be formed from one or several layers.

In order to be able to electrically connect the individual electronic components to be arranged on the printed circuit board with each other, the substrate is provided with at least one, preferably with a plurality, of conductive tracks separate from each other. The conductive tracks preferably also comprise soldering surfaces, or respectively lands in order to be able to conductively connect the electronic components to the conductive tracks. The conductive tracks are preferably produced by illumination and/or by etching. Each conductive track is particularly preferably formed from a thin layer of copper or a copper-containing alloy, wherein a conductive track most preferably has a thickness of 35 µm.

According to the invention, at least one surface of the substrate is coated with a functional lacquer layer, wherein this can be both a partial surface as well as a full surface coating of the surface. Preferably, there is a substantially full-surface coating, in particular with the exception of connecting points for electrical components, electrical conductors or the like. Particularly preferably at least one surface, and most preferably each surface of the substrate having conductive tracks is coated entirely, with the exception of the connecting points, in particular the lands. The surface of the substrate to be coated can be a surface of the material of the substrate itself, and/or a surface of one or more of the materials applied to the substrate, such as for example conductive tracks. Likewise preferably, the printed circuit board is cleaned and/or dried before being coated with the functional lacquer layer.

First of all, the functional lacquer layer can have any desired function that deviates from a labeling of the substrate, or respectively of the printed circuit board. The functional lacquer layer can have one or simultaneously several functions. These functions can for example be a mechanical and/or electrical protection of the components lying underneath, in particular of the conductive tracks. Furthermore, soldering components can be assisted by the functional lacquer layer in that the lacquer layer contains a flux. Alternatively, the functional lacquer layer can have a repulsive effect for flux and/or for the soldering agent, in particular a tin solder, and thereby assist the isolation of the individual conductive tracks and/or the soldering points from each other. The lacquer layer can be formed of any desired material, in particular any desired lacquer composition. The lacquer composition and/or the cured or dried lacquer of the functional lacquer layer is preferably not entirely transparent and/or not color-free. Particularly preferably, the lacquer composition and/or the cured or dried lacquer is however colored, and most preferably partially transparent so that the conductive tracks are visible through the partially transparent lacquer, and simultaneously there is a colored appearance of the lacquer layer.

The labeling can in principle be formed in any desired manner and contain lettering, numbers, other characters, brand logos, barcodes, QR codes, pictograms or other markings. The labeling can inter alia be provided for dimensions, for instructing a user or manufacturer of an electronic component, for brand identification, or for any other purposes. The labeling can be in any desired fonts and/or desired font sizes, as well as at any desired position on the surface of the substrate, or respectively the printed circuit board.

The labeling according to the invention has different color shades in order to distinguish the coating with the functional lacquer layer and the labeling from each other so that the labeling is haptically and/or visually perceptible. Preferably, the labeling is visually perceptible. "Different color shades" only means in the first place that there are at least two different color shades, wherein a first shade forms the background, and a second shade forms the labeling. Preferably, the labeling is darker than the background. More preferably, the entire background has an extensive and/or uniform color shade that is particularly preferably brighter than all the labeling. In principle, it is however also conceivable to create the background coating in several color shades, for example in order to depict a graphic, a brand logo and/or a pictogram. Although the labeling in principle only has to be produced from a single color shade deviating from the background color shade, it is preferable to use several color shades in the labeling that differ from each other. Preferably, all color shades of the labelings are fashioned darker than the color shades of the background surrounding the labeling in each case, and particularly preferably darker than all color shades of the background.

In a preferred embodiment of the method according to the invention, coating with the functional lacquer layer and labeling by means of the functional lacquer layer is simultaneous; consequently, a separate labeling system is unnecessary, and particularly fast and easy production of the labeled printed circuit board is moreover enabled. A "simultaneous coating and labeling" is first of all understood to merely mean that the labeling occurs before the coating is completely dry so that the coating and the labeling preferably form a single layer on the surface of the substrate, or respectively of the printed circuit board. Particularly preferably, the coating and the labeling occur in a single simultaneous application method and/or without a temporal delay from each other.

According to an advantageous further embodiment of the method according to the invention, the at least one different color shade of the labeling is achieved with a different layer thickness or a different color density of the applied functional lacquer layer, which also enables particularly simple, energy-conserving and fast production of the labeled printed circuit board. The "layer thickness of the lacquer layer" is understood to mean the thickness of the dried lacquer vertically on the surface of the substrate, or respectively the printed circuit board, and the color density describes in principle the applied amount of paint per area, wherein this can be achieved not just by a greater layer thickness, but also by a closer distance between adjacent printing points.

Although the substrate can in principle be coated with the functional lacquer layer in any desired manner, for example by screen printing, it is preferred for the coating and/or the labeling with the functional lacquer layer to occur by means of an inkjet printing method, which enables particularly precise, fast and energy-conserving application of the functional coating. This is preferably done in particular by means of a single inkjet printer. It is also preferable for the inkjet printing method to be an ink, or respectively lacquer jet printing method that particularly preferably generates a printed image, or respectively a coating in matrix printing, and/or by specifically discharging small ink, or respectively lacquer drops. Correspondingly, it is also particularly preferred to generate the different color shades of the coating and the labeling by a local variation in the printing density, in particular the inkjet print points per area.

A preferred embodiment of the method according to the invention provides using a solder resist to produce the functional lacquer layer, whereby the labeling advantageously occurs together with the production of the printed circuit board and the preparation for populating with electronic components. It is preferable for the solder resist to cover the conductive tracks and to leave the soldering points free. In principle, the solder resist can have any desired composition and any desired color. Preferably, the solder resist has a green, red, blue or white color. A multi-color coating, in particular with solder resist, is also conceivable, in particular by means of an inkjet printing method, with at least one nozzle per color in each case. Preferably, exclusively one single coating composition, particularly preferably one single lacquer, and most preferably one single solder resist is used when coating.

According to an advantageous further embodiment of the method according to the invention, the functional lacquer layer forms the outer surface of the printed circuit board, and/or no further labeling is applied to the functional lacquer layer and/or to the outer surface of the printed circuit board, which enables particularly fast and energy-conserving production of the labeled printed circuit board. Also preferably, there is also no labeling layer under the functional lacquer layer. Particularly preferably, the functional lacquer layer is the only lacquer layer on the surface of the substrate, or respectively the printed circuit board. Most preferably, the functional lacquer layer forms the final coating and/or the final surface layer of the printed circuit board. Correspondingly, an embodiment of the method is preferred in which no further treatment of the functional lacquer layer is necessary after applying the coating and the labeling, wherein in particular there is no modification of the surface of the printed circuit board by applying additional materials or additional labelings, or by removing part of the functional lacquer layer.

In order to produce a particularly distinctive labeling, however, it can be provided to produce or reinforce the labeling by a second application of material of the functional lacquer layer, in particular solder resist. In a corresponding embodiment of the method, in this case it is however preferred that both lacquer layers have an identical composition and/or are made of an identical lacquer. In particular, it is preferred for the second coating to occur before the first coating is dry so that particularly preferably, a single, in particular homogeneous functional coating results on the finished, labeled printed circuit board.

In a preferred embodiment of the method according to the invention, an individual labeling is made for each individual substrate to be coated and labeled, whereby in a particularly advantageous manner, for example an individual labeling, but also a progressive labeling, for example with serial numbers, is easily possible. The coating is particularly preferably without an invariable template, which in particular is possible by means of an inkjet printing application of the functional lacquer coating.

Finally, an advantageous further embodiment of the method according to the invention provides that the labeling occurs at an even and/or unchanged printing speed which enables particularly fast and easy production of the labeled printed circuit board. A method, in particular using an inkjet printer with an even printing throughput, in particular independent of the color shade of the functional lacquer coating, is particularly preferred.

An exemplary embodiment of the method according to the invention is explained in greater detail below with reference to the drawing. In the FIGURE:

FIG. 1 shows a schematic sectional view of a coated and labeled printed circuit board.

A labeled printed circuit board 1 shown in FIG. 1 is produced according to an embodiment of the method according to the invention. To accomplish this, a substrate 3 consisting of fiber-reinforced plastic and coated with copper conductive tracks 2 is fed to an inkjet printing system. The conductive tracks 2 are produced by illumination and subsequent etching.

In the inkjet printing system, there is a substantially extensive coating of the surface of the substrate 3 as well as the conductive tracks 2 with a functional solder resist 4, in particular based on epoxy resin, to ensure a precise soldered connection when populating the printed circuit board 1 with electronic components and subsequently soldering the components, and to avoid the formation of undesirable solder bridges. Moreover, the solder resist 4 increases the electric strength, protects the conductive tracks 2 from corrosion, and reduces the consumption of tin solder while soldering the electronic components.

The coating with the functional solder resist 4 is done nearly of the entire surface, wherein the lands 7 on the surface of the conductive tracks 2 are omitted to allow components to be soldered.

Moreover, a labeling of the substrate 3 is also carried out simultaneous to the extensive coating by means of the inkjet printing system. To accomplish this, a solder resist 4 is used that cures colored and partially transparent. At the positions at which labeling is to occur on the surface of the substrate 3, the solder resist 4 is applied with a high printing density during the extensive coating so that a contrast in color results in comparison to the other coated surface. By means of different print densities in individual regions in comparison to the functional solder resist layer 4, it is possible to produce labelings with darker color shades 5, 6.

These labelings can be both batch or lot IDs, as well as comprise any characters, trademarks or other information such as barcodes or QR codes. Given the greater layer thickness of the regions labeled with a higher print density, a quite visually apparent and haptically perceptible labeling results with a darker color shade 5, 6.

What is claimed is:

1. A method for producing a labeled printed circuit board comprising:
   supplying a substrate provided with conductive tracks,
   coating at least one surface of the substrate with a functional lacquer to result in a functional lacquer layer having a first color shade of a color, wherein the conductive tracks are at least partially coated with the same functional lacquer, and wherein
   a labeling of the substrate is carried out by applying the same functional lacquer on a part of said at least one surface of the substrate to result in a second color shade of the same color of the functional lacquer layer achieved by a different layer thickness, or a different color density of the coating and the labeling to distinguish the coating and the labeling made from the same functional lacquer from each other, wherein the labeling is haptically perceptible, visually perceptible, or haptically and visually perceptible.

2. The method for producing a labeled printed circuit board according to claim 1, wherein the coating and the labeling are simultaneous.

3. The method for producing a labeled printed circuit board according to claim 1, wherein the coating and labeling are both carried out using an inkjet printing method.

4. The method for producing a labeled printed circuit board according to claim 1, wherein the different color shades of the coating and the labeling are achieved by a local variation in the inkjet print points per area.

5. The method for producing a labeled printed circuit board according to claim 1, wherein the functional lacquer layer forms the outer surface of the substrate, and/or no additional labeling is applied on the functional lacquer layer.

6. The method for producing a labeled printed circuit board according to claim 1, wherein the labeling is produced or reinforced by a second application of the same print medium of the layer.

7. The method for producing a labeled printed circuit board according to claim 1, wherein an individual labeling is carried out for each individual substrate to be coated and to be labeled.

8. The method for producing a labeled printed circuit board according to claim 1, wherein labeling occurs at an even and/or unchanged printing speed.

9. A labeled printed circuit board, comprising:
   at least one surface of a substrate provided with conductive tracks at least partially coated with a functional lacquer,
   an at least partial surface coating with the same functional lacquer resulting in a functional lacquer layer on the surface of the substrate having a first color shade of a color, and
   a labeling of the substrate carried out by applying the same functional lacquer on a part of said surface of the substrate to result in a second color shade of the same color of the functional lacquer layer achieved by a different layer thickness, or a different color density of the coating and the labeling to distinguish the coating and the labeling made from the same functional lacquer from each other, wherein the labeling is haptically perceptible, visually perceptible, or haptically and visually perceptible.

* * * * *